United States Patent
Kang et al.

[11] Patent Number: 5,841,725
[45] Date of Patent: Nov. 24, 1998

[54] CHARGE PUMP CIRCUIT FOR A SEMICONDUCTOR MEMORY DEVICE

[75] Inventors: Chang-Man Kang, Kyungki-Do; Young-Hyun Jun, Seoul, both of Rep. of Korea

[73] Assignee: LG Semicon Co., Ltd., Cheongju, Rep. of Korea

[21] Appl. No.: 918,667

[22] Filed: Aug. 28, 1997

[30] Foreign Application Priority Data

Apr. 2, 1997 [KR] Rep. of Korea .................. 1997 12109

[51] Int. Cl.⁶ ..................................... G11C 5/14
[52] U.S. Cl. .................... 365/226; 365/189.09; 327/536; 327/537
[58] Field of Search .......................... 365/189.09, 189.11, 365/226; 327/589, 390, 536, 537, 538

[56] References Cited

U.S. PATENT DOCUMENTS

| | | | |
|---|---|---|---|
| 5,276,646 | 1/1994 | Kim et al. | 365/189.09 |
| 5,367,489 | 11/1994 | Park et al. | 365/189.11 |
| 5,701,096 | 12/1997 | Higashiho | 327/536 |
| 5,729,172 | 3/1998 | Tsukada | 327/536 |

*Primary Examiner*—Son Mai
*Attorney, Agent, or Firm*—Fleshner & Kim

[57] ABSTRACT

A charge pump circuit of a semiconductor memory device provides high efficiency. A high voltage detector outputs a high voltage detection signal. A regulator outputs a high level and a controller is triggered at a descent edge of a row access strobe bar signal and outputs a high level row access strobe bar pulse signal. An oscillator generates an oscillation pulse signal in accordance with the high level turn-on signal outputted from the regulator. A charge pump performs a pumping operation until the oscillation pulse signal reaches a potential of (Vdd+2Vt) when the oscillation pulse signal is applied thereto, and halts the pumping operation when the high level high voltage detection signal is applied. A pull-up transistor precharges the raised voltage Vpp to a potential of (Vdd−Vt) when power is turned on. The circuit enables a charge pump to have a double booster and a pumping capacitor, thereby satisfying a fast charge supply at a low level voltage and to supply an appropriate amount of charge at a high level voltage.

19 Claims, 8 Drawing Sheets

CONVENTION ART

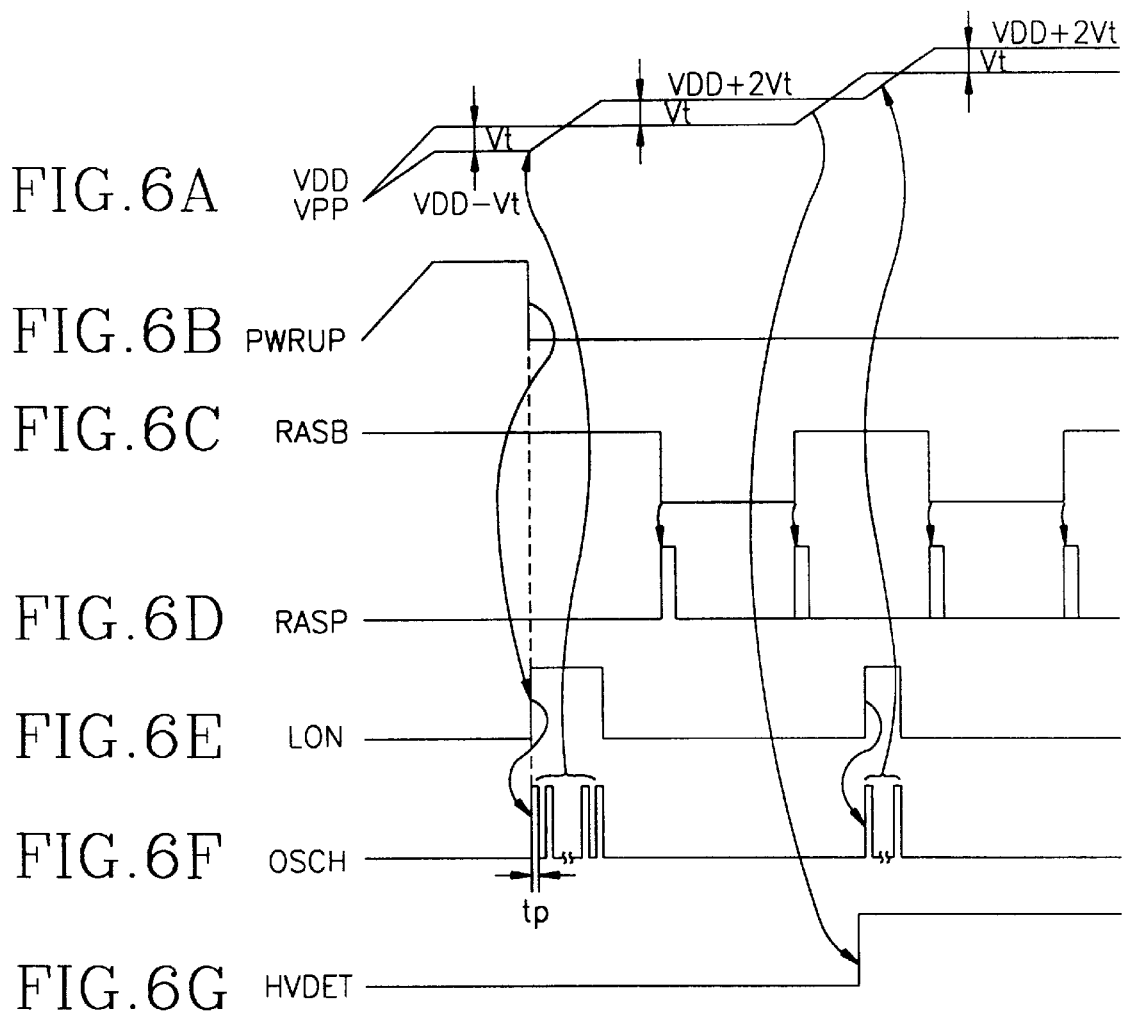

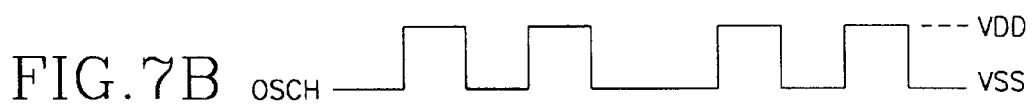
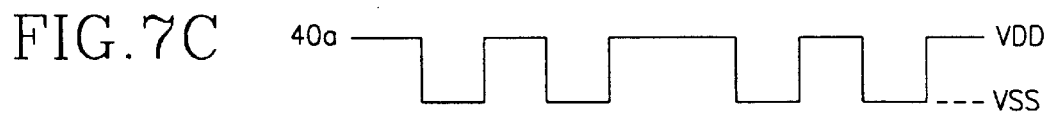
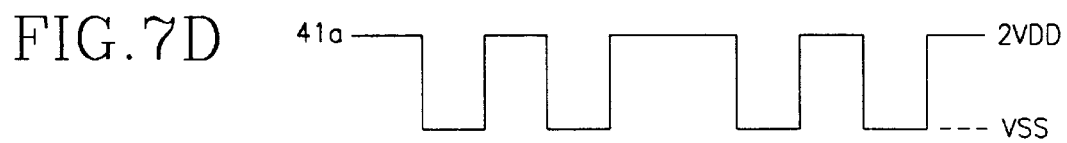
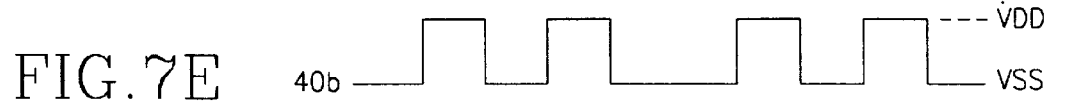
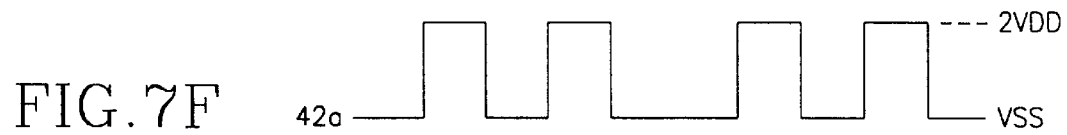
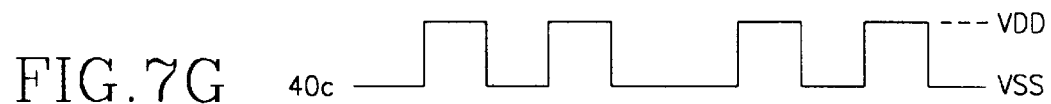
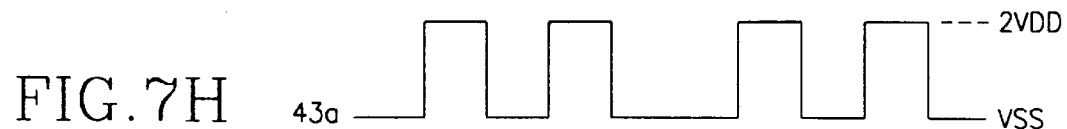
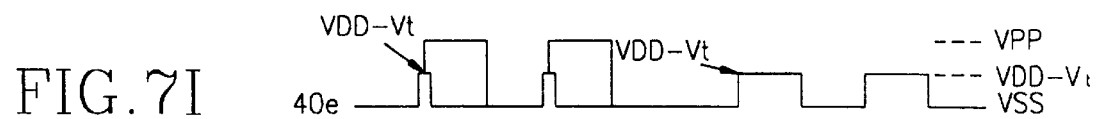
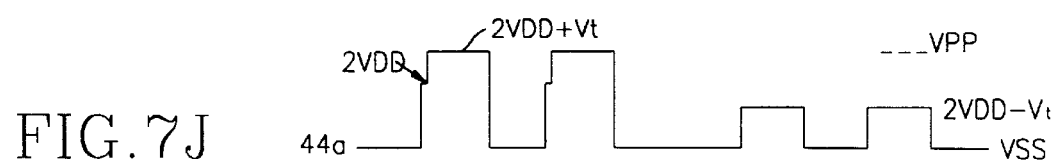

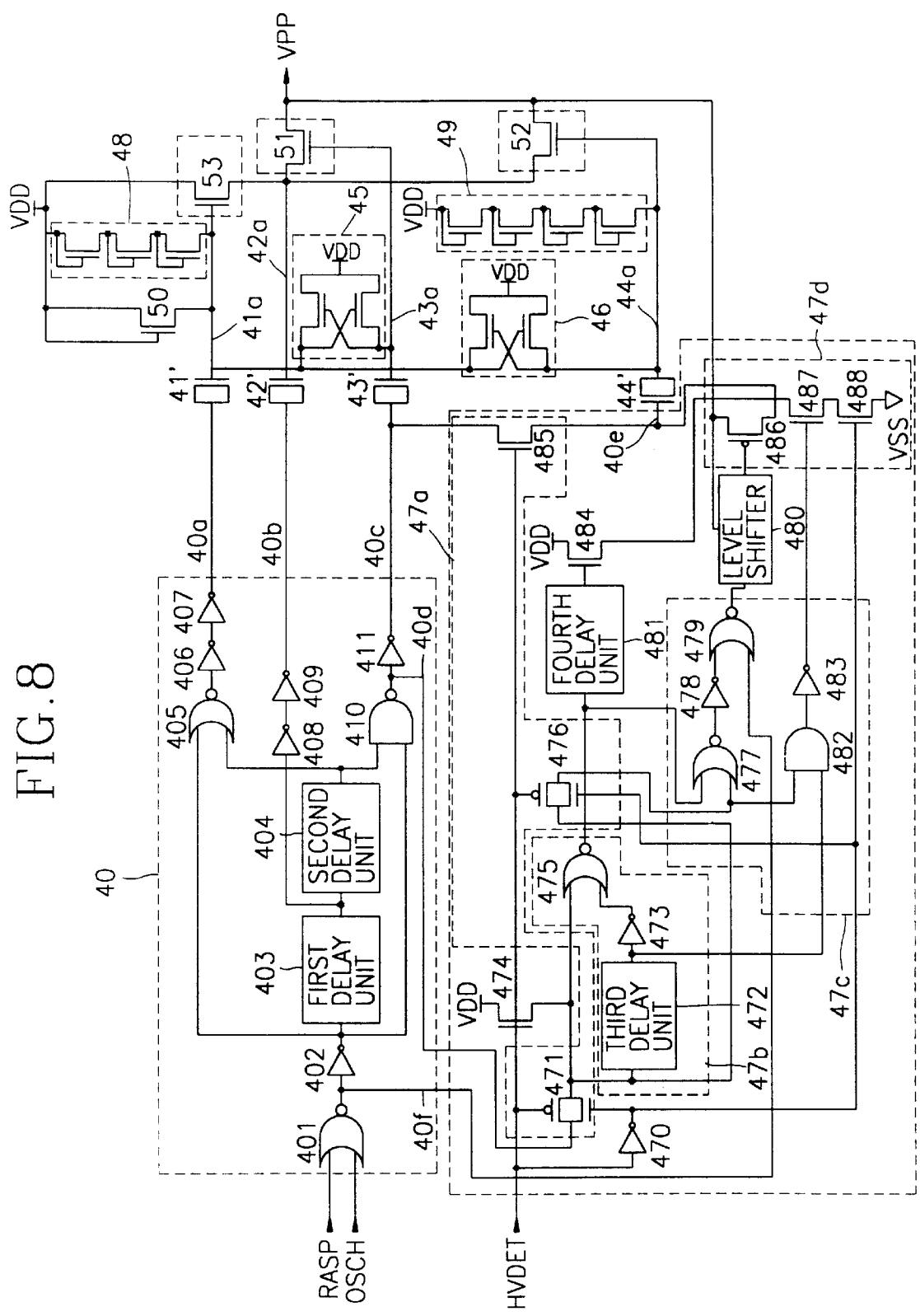

CHARGE PUMP CIRCUIT FOR A SEMICONDUCTOR MEMORY DEVICE

BACKGROUND OF THE INVENTION

1. Field of the Invention

The present invention relates to a memory device, and more particularly, to an improved charge pump circuit for a semiconductor memory device.

2. Background of the Related Art

FIG. 1 illustrates a charge pump circuit for a related art semiconductor memory device. An oscillator 11 receives an enable signal, carries out an oscillation operation, and generates a pulse signal. First and second clamps 12, 14 fix the pulse signal generated from the oscillator 11 to a constant potential level when the potential of the pulse signal generated from the oscillator 11 is higher than a predetermined value. The capacitors 13, 15 are connected in parallel between the oscillator 11 and the first clamp 12 and the second clamp 14 and boosts the potential of the pulse signal outputted from the oscillator 11 to a required voltage level. An output transistor 16 has a drain connected to an output signal of the capacitor 13, a gate connected to an output signal of the capacitor 15, and a source connected to an output node 17.

Pull-up transistor 18 is connected between the output node 17 and a supply potential Vcc and carries out a precharge operation when power is turned on. An overvoltage detector 19 is connected between the oscillator 11 and the output node 17 and detects an overvoltage state of the output node 17 so that when an overvoltage occurs at the output node 17, the oscillator 11 stops its operation. The line capacitor 20 and the charge capacitor 21 are cooperated with an output value of the output capacitor 16 so as to output a raised voltage. The decoupling capacitor 22 is cooperated with a charge pump so as to output a stably raised voltage.

When the power is turned on, a supply potential Vcc is applied to the pull-up transistor 18. The applied supply potential Vcc is lowered by a threshold voltage level Vt of the pull-up transistor 18, and a lowered voltage of (Vcc−Vt) is applied to the output node 17. The voltage (Vcc−Vt) precharged to the output node 17 is detected in the overvoltage detector 19.

Since the voltage (Vcc−Vt) detected in the overvoltage detector 19 is lower than the supply voltage Vcc, the overvoltage detector 19 outputs an enable signal EN to the oscillator 11 for thereby operating the oscillator 11. Accordingly, the oscillator 11 carries out an oscillation operation and generates a pulse signal.

When the potential generated from the oscillator 11 is a low level, the first and second clamps 12, 14 are deactivated, and the capacitors 13, 15 carry out a pumping operation. Accordingly, the respective potentials at the drain and gate of the output transistor 16 is raised to twice the supply potential Vcc. The output transistor 16 is turned on, and a source terminal voltage Vccw of the output transistor 16 reaches a voltage of (2Vcc−Vt), where Vt is a threshold voltage of the output transistor 16. The voltage of (2Vcc−Vt) is applied to a memory cell through the output node 17.

At this time, the overvoltage detector 19 repeatedly detects the voltage at the output node 17 and controls the operation of the oscillator 11 in accordance with the detected voltage value. The repeated detection by the overvoltage detector 19 continues until a detected resultant value reaches up to a potential (Vcc+Vt). When an overvoltage is detected during the repeated operation, the overvoltage detector 19 renders the oscillator 11 to stop its operation.

Meanwhile, when the voltage supplied to the charge pump is not appropriate, the pull-up transistor 18 is employed to effectively bypass the charge pump. That is, the pull-up transistor 18 is operated when the source terminal voltage Vccw is less than a voltage of Vcc−Vt (Vccw<(Vcc−Vt)), and the pull-up transistor 18 is turned off when the source terminal voltage Vccw is larger than a voltage of Vcc−Vt (Vccw>(Vcc−Vt)).

However, the potential of the drain and gate terminals of the output transistor 16 during a pumping operation is twice the supply voltage (2Vcc), whereas the voltage at the output node 17 is lowered to an extent of the threshold voltage of the output voltage 16 to thereby result in a voltage of (2Vcc−Vt). As a result, the charge at the drain terminal of the output transistor 16 is not sufficiently transferred to the output node 17. Further, because the drain terminal charge of the output transistor 16 is not sufficiently transferred to the output node 17, the pumping efficiency is lowered at a low voltage, thereby resulting in an instable operation when a low voltage is applied.

SUMMARY OF THE INVENTION

Accordingly, it is an object of the present invention to provide a charge pump circuit having a high efficiency for a semiconductor memory device capable of generating a raised voltage using a supply voltage provided from an exterior of the chip or an internal voltage, and outputting the -generated high voltage to an output node without loss.

It is another object of the present invention to provide a charge pump circuit having a high efficiency for a semiconductor memory device which makes it possible to immediately supply charge to an output node having a low voltage level and carry out a stable operation by enhancing a pumping efficiency.

It is a further object of the present invention to provide a charge pump circuit having a high efficiency for a semiconductor memory device capable of decreasing electrical power amount by supplying an appropriate amount of charge to an output node having a high voltage.

To achieve the above-described objects, there is provided a charge pump circuit having a high efficiency for a semiconductor memory device which includes a high voltage detector for outputting a high voltage detection signal when an applied supply voltage reaches up to a predetermined voltage level, a regulator for outputting a high level on signal when a raised voltage is lowered below a predetermined voltage while detecting the raised voltage being applied during a power-on, a controller for being triggered at a descent edge of a row access strobe bar signal and outputting a high level row access strobe bar pulse signal, an oscillator for generating an oscillation pulse signal in accordance with the high level turn-on signal outputted from the regulator, a charge pump for carrying out a pumping operation until the oscillation pulse signal reaches up to a potential value (Vdd+2Vt) when the oscillation pulse signal is applied thereto from the oscillator, and halting the pumping operation when the high level high-voltage detection signal is applied, a full-up transistor for precharging the raised voltage Vpp to a potential value (Vdd−Vt) when power is turned on, and a decoupling capacitor connected to a final output terminal and for carrying out a charge accumulation and a decoupling operation.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 6A through 6G are timing diagrams of respective signals in the diagram of FIG. 2;

FIGS. 7A through 7J are timing diagrams of respective signals in the diagram of FIG. 4; and FIG. 8 is a block diagram of a charge pump circuit having a high efficiency for a semiconductor memory device according to a second embodiment of the present invention.

DETAILED DESCRIPTION OF PREFERRED EMBODIMENTS

Figure 1:
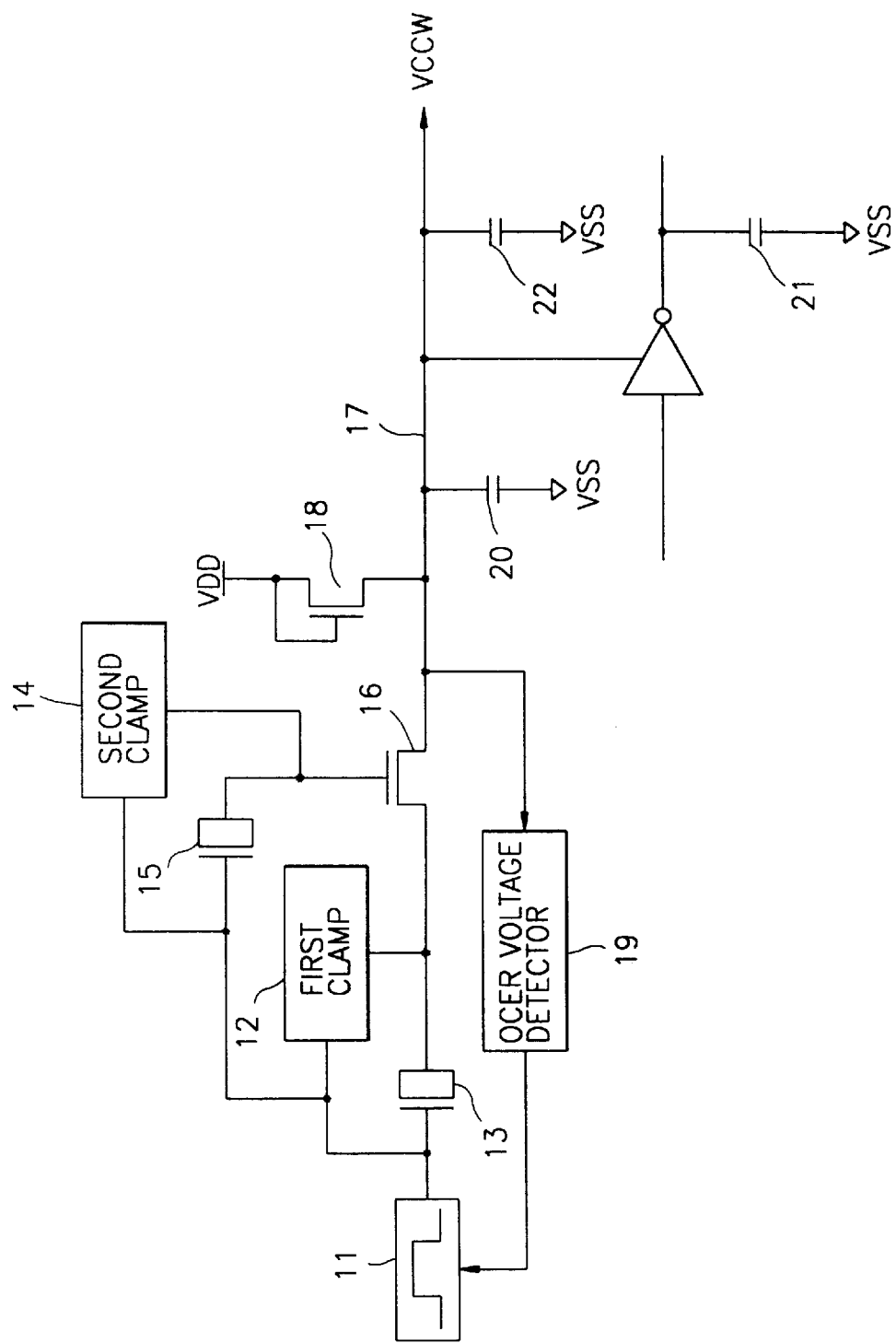
FIG. 1 is a block diagram of a charge pump circuit of the related art.
Figure 2:
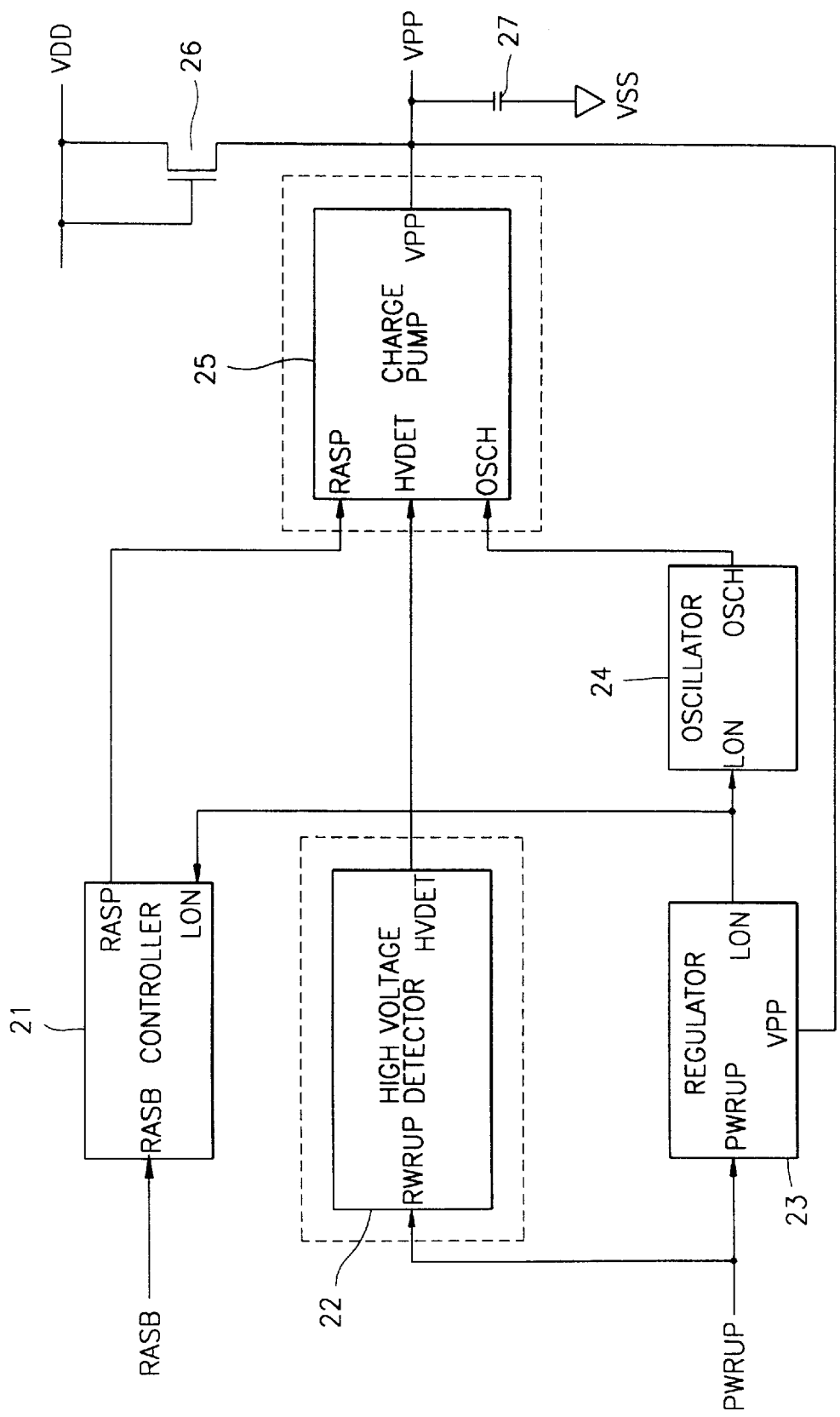
FIG. 2 is a block diagram of a charge pump circuit having a high efficiency for a semiconductor memory device according to a first embodiment of the present invention.

FIG. 2 illustrates a charge pump circuit having a high efficiency for a semiconductor memory device according to a first embodiment of the present invention. A high voltage detector 22 outputs a high voltage detection signal HVDET when an applied supply voltage Vdd reaches a predetermined voltage level. A regulator 23 outputs a high level on-signal LON when a raised voltage Vpp is lowered below a predetermined voltage and detects a raised voltage Vpp applied during a power-on. A controller 21 is triggered at a descent edge of a RASB (Row Access Strobe Bar) signal and outputs a high level RASB pulse signal RASP. An oscillator 24 generates an oscillation pulse signal OSCH in accordance with the high level on-signal LON outputted from the regulator 23. A charge pump 25 carries out a pumping operation until the signal OSCH reaches up to a potential value (Vdd+2Vt) when the oscillation pulse signal OSCH is applied thereto from the oscillator 24, and halts the pumping operation when the high level high-voltage detection signal HVDET is applied. A pull-up transistor 26 precharges the raised voltage Vpp to a potential (Vdd−Vt) when the power is turned on. A decoupling capacitor 27 is connected to a final output terminal and carries out a charge accumulation and a decoupling operation.

Figure 3:
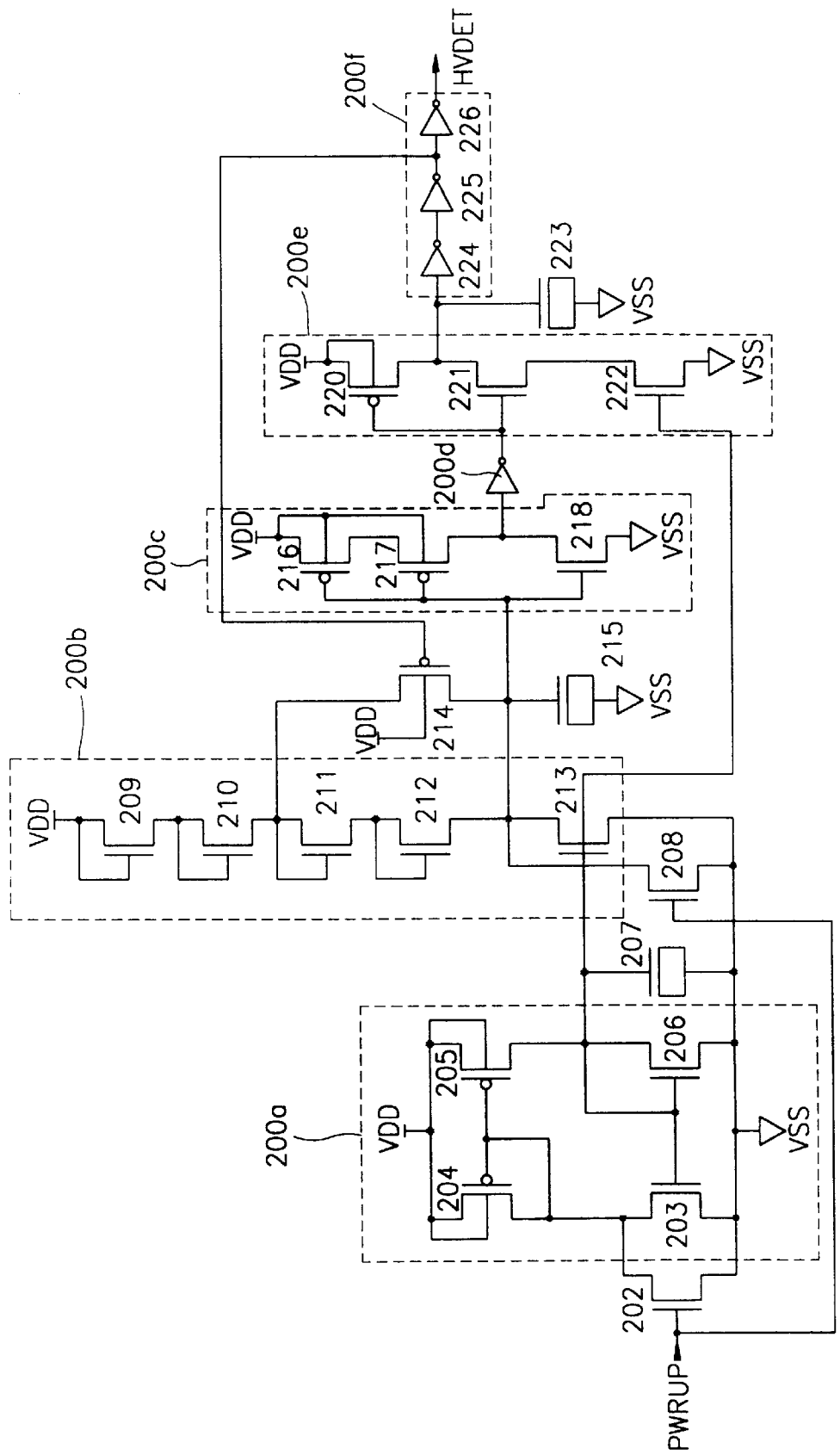
FIG. 3 is a detailed circuit view of a high voltage detector in the diagram of FIG. 2.

FIG. 3 illustrates a detailed schematic of the high voltage detector 22. A reference voltage generator 200a generates a randomly determined reference voltage when power is turned on. A level detector 200b detects the level of applied supply potential Vdd and outputs a detected signal. The first through fourth inverters 200c–200f delay the detection signal of the level detector 200b for a predetermined time, adjust its output timing, and output the adjusted signal.

Figure 4:
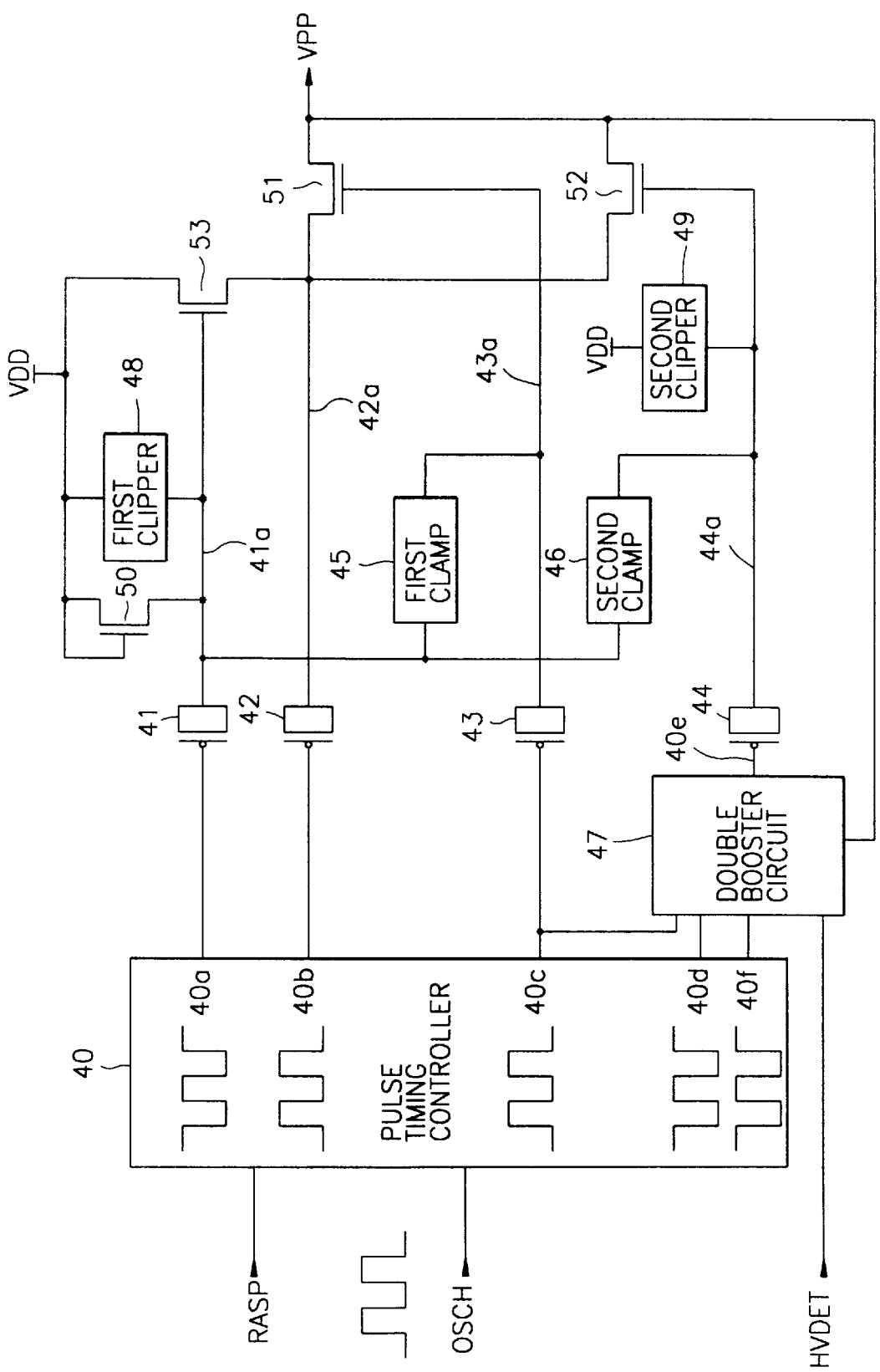
FIG. 4 is a block diagram of a charge pump in the diagram of FIG. 2.

FIG. 4 illustrates a detailed schematic of the charge pump 25 illustrated in FIG. 2. A pulse timing controller 40 generates a first to fifth pulse signals 40a, 40b, 40c, 40d, 40f, each having a predetermined pulse width in accordance with a level of the pulse signal RASP or the oscillation pulse signal OSCH. A first through fourth pumping capacitors 41–44 carry out a pumping operation in accordance with a corresponding level of pulse signals outputted from the pulse timing controller 40.

A double booster circuit 47 receives the third through fifth pulse signals generated from the pulse timing controller 40, carries out a double boosting operation to obtain a required level thereof, and halts the double boosting operation when the high level high-voltage detection signal HVDET is applied. A pull-up transistor 50 maintains an output node 41a of the first pumping capacitor 41 at a potential (Vdd−Vt) when power is turned on. A second clamp 46 clamps a potential of the output node 41a between the output node 41a of the first pumping capacitor 41 and an output node 44a of the fourth pumping capacitor 44, and maintains the output node 44a to a predetermined level voltage. A first clamp 45 clamps the voltage of the output node 41a between the output node 41a and the output node 43a of the third pumping capacitor 43, and maintains the output node 43a to a predetermined level voltage. First and second clippers 48, 49 clip the applied high voltage supply voltage Vdd to a predetermined voltage, and maintain the corresponding output nodes 41a, 44a of the first and fourth pumping capacitors 41, 44 respectively to a predetermined level voltage in accordance with the clipped voltage. A MOS transistor 53 maintains the output node 42a of the second pumping capacitor 42 to the supply potential Vdd during an initial pumping operation; and first and second output transistors 51, 52 transmit the charge of the output node 42a to an output node.

The operation and effects of the thusly constituted charge pump circuit having a high efficiency for a semiconductor memory device according to the present invention will now be described.

First, as shown in FIG. 2, when the supply voltage Vdd is externally applied, the raised voltage Vpp being outputted to the output node is precharged to a potential Vdd−Vt, as shown in FIG. 6A. Here, the label numeral Vt denotes a threshold voltage of the pull-up transistor 26. When a power-up signal PWRUP is transitted from a high level to a low level as shown in FIG. 6B, the on-signal LON of the regulator 23 transits from a low level to a high level, as shown in FIG. 6E, which is applied to the oscillator 24.

In an initial stage of power-on tp (FIG. 6F), in accordance with turning-on of the pull-up transistor 50, the node 41a having a potential of (Vdd−Vt) is raised up to a potential (2Vdd+Vt) by a pumping operation of the first pumping capacitor 41. The raised voltage turns on the MOS transistor 53 to thereby maintain node 42a to a Vdd potential.

The output node 41a of the first pumping capacitor 41 maintains a 2Vdd−Vt potential, so that the first and second clamps 45, 46 respectively carry out a clamping operation. The corresponding output nodes 43a, 44a of the third and fourth capacitors 43, 44 respectively maintain a Vdd potential. The second and third pumping capacitors 42, 43 which respectively received low level pulse signals 40b, 40c from the pulse timing controller 40 are not operated.

The oscillator 24, which receives the high level on signal LON from the regulator 23, is triggered at an ascent edge of the on signal LON, resulting in the generation of an oscillation pulse signal OSCH having a predetermined pulse width, as shown in FIG. 6F. The generated oscillation pulse signal OSCH is applied to and pumped in the charge pump 25 until the raised voltage Vpp reaches a potential of (Vdd+2Vt).

When the raised voltage Vpp reaches a predetermined potential of (Vdd+2Vt), the on signal LON in the regulator 23 transits to a low level for halting the operation of the oscillator 24. The oscillator 24 stops the generation of the oscillation pulse signal OSCH and the charge pump 25 halts the pumping operation.

When the raised voltage Vpp is lower than a potential of (Vdd+2Vt), the regulator 23 outputs a high level on signal LON to enable the oscillator 24. The enabled oscillator 24 outputs an oscillation pulse signal OSCH, and the charge pump 25 increases the potential of the raised voltage Vpp to a potential of (Vdd+2Vt). The controller 21 receiving the high level on signal LON from the regulator 23 and an externally applied RASB signal of a high level to output a RASP pulse signal of a low level. When the RASB signal transits from an ascent edge to a descent edge, as shown in FIG. 6C, the RASP pulse signal of a high level is outputted for ten nanoseconds to the charge pump 25, as shown in FIG. 6D. At this time, the charge pump 25, which receives the high level RASP pulse signal carries out a pumping operation and is enabled until the raised voltage Vpp is raised to a potential of (Vdd+2Vt). Although the charge pump 25 performs a pumping operation and the signal level therein is raised to a potential of (Vdd+2Vt), the charge pump 25 becomes synchronous to the low level RASB signal.

The high voltage detector 22 repeatedly detects the supply voltage Vdd, and when the supply voltage Vdd reaches a predetermined voltage level, as shown in FIG. 6A, a high level high-voltage detection signal HVDET, as shown in FIG. 6G, is outputted to the charge pump 25 to halt the operation of the double booster circuit of the charge pump 25.

With reference to FIGS. 4, 5, and 7A–7J, there will be followed an explanation with regard to the charge pump 25 for carrying out a pumping operation by receiving the RASP pulse signal and the oscillation pulse signal OSCH until the raised voltage Vpp reach a potential of (Vdd+2Vt), and operation thereof when a high level high-voltage detection signal HVDET is applied.

First, when the RASP pulse signal or the oscillation pulse signal OSCH is applied to the charge pump 25, the pulse timing controller 40 outputs a high or low level pulse signals 40a, 40b, 40c, 40d, 40f. As shown in FIGS. 7B, 7C, 7E and 7G, when the low level oscillation pulse signal OSCH is applied, the pulse timing controller 40 generates first, fourth and fifth pulse signals 40a, 40d, 40f, of a high level and second and third pulse signals 40b, 40c of a low level.

When the oscillation pulse signal OSCH is rendered from a low level to a high level as shown in FIG. 7B, the pulse timing controller 40 generates the low or high level signals 40a, 40b, 40c, 40d, 40f. That is, the pulse signals 40a, 40d, 40f are respectively rendered to a low level, and the pulse signals 40b, 40c are respectively rendered to a high level.

In accordance with turning-on of the MOS transistor 53, the output nodes 42a, 43a which were respectively precharged by a Vdd potential are respectively turned to a 2Vdd potential, as shown in FIGS. 7F and 7H, in accordance with pumping operation of the second pumping capacitor 42 and the third pumping capacitor 43. The node 40e generates a pulse signal having a Vdd–Vt potential for several nanoseconds of width, as shown in FIG. 7I in accordance with the operation of the double booster circuit 47.

Figure 5:
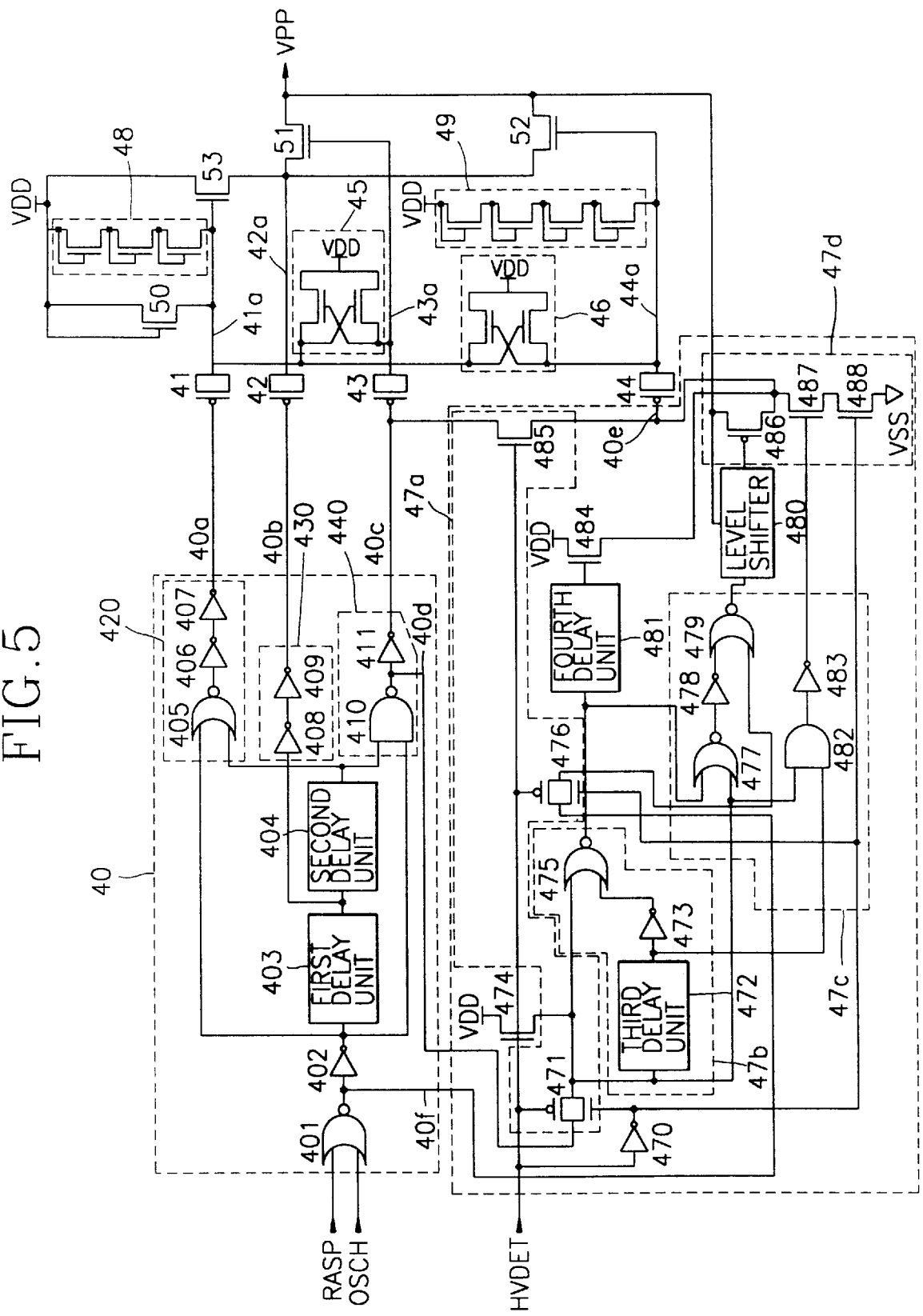
FIG. 5 is a detailed circuit view of respective portions in the diagram of FIG. 4.

Afterward, the level shifter 480, as shown in FIG. 5, is operated after the several nano seconds, and in accordance with the operation of the level shifter 480, a pulse signal having a Vpp potential is returned, so that in a precharge voltage having a Vdd potential, the voltage at the node 44a becomes raised to a 2Vdd+Vt potential in accordance with the fourth pumping capacitor 44, as shown in FIG. 7J. When the node 41a connected to the first clipper 48 and the node 44a connected to the second clipper 49 generate a voltage higher than a predetermined one, the extra voltage above the predetermined one is cut off to thereby maintain a constant voltage. Hence, the potential at the node 41a is maintained at a Vdd level, and the nodes 42a, 43a are respectively turned to a 2Vdd level, as shown in FIGS. 7F and 7H. The peak potential at the node 44a is maintained at a 2Vdd+Vt level, as shown in FIG. 7J, thereby turning on the NMOS transistors 51, 52, and accordingly, the potential of the node 42a is sufficiently transmitted to the Vpp node.

The so far operation deals with a case in which the high voltage detection signal HVDET being applied to the double booster circuit 47 is a low level. When a Vdd voltage is raised and reached to a voltage predetermined in the high voltage detector 22, there is generated a high level high-voltage detection signal HVDET, whereby the double booster circuit 47 does not carry out a double boosting operation.

At this time, when the oscillation pulse signal OSCH is in a low level, the transistor 485 in the pulse input controller 47a of the doubled booster circuit 47, as shown in FIG. 5, is turned on. The node 40e is rendered to a low level because the low level pulse signal 40c is transmitted to the node 40e.

Although the oscillation pulse signal OSCH is turned to a high level, the potential at the node 40e is operated until it reaches a Vdd–Vt potential in accordance with the transistor 485. The potential at the node 44a is decreased until it reaches a 2Vdd–Vt potential, as shown in FIG. 7J, in accordance with the pumping operation of the fourth pumping capacitor 44. As the Vdd potential becomes higher, a voltage induced at the gate terminal of the second output transistor 52 or at the node 44a becomes controllable and serves to protect a semiconductor memory device, for thereby enabling a stable operation.

The above-described operation with regard to FIG. 4 will be further detailed with reference to FIG. 5. The RASP pulse signal and the oscillation pulse signal OSCH are NORed in a NOR gate 401 of the pulse timing controller 40. The NOR gate 401 outputs the fifth pulse signal 40f to the double booster circuit 47. The fifth pulse signal 40f is inverted via a first NOT gate 402, and delayed passing through first and second delay units 403, 404 for a predetermined time.

A first NOR gate 405 in the first pulse generator 420 NORs the pulse signal inverted in the first NOT gate 402 and the signal which passed through the first and second delay units 403, 404. The output signal from the NOR gate 405 sequentially passes through a second and third NOT gates 406, 407 to thereby output a first pulse signal 40a. In the second pulse generator 430, the signal which passed through the first delay unit 403 is sequentially passed through the fourth and fifth NOT gates 408, 409, so that there is generated a second pulse signal 40b. having a phase contrary to that of the first pulse generator 420.

A signal converted in the first NOT gate 402 and a signal which passed through the first and second delay units 403, 404, are NANDed in a first NAND gate 410 in the third pulse generator 440 which accordingly outputs the fourth pulse signal 40b to the double booster circuit 47. The fourth pulse signal 40d is converted to a third pulse signal 40c which has a phase contrary to that of the fourth pulse signal 40d via the six NOT gate 411.

When a high level oscillation pulse signal OSCH is applied, the pulse signals 40a, 40d, 40f are respectively rendered to a low level, and the pulse signals 40b, 40c are respectively turned to a high level. When a low level oscillation pulse signal OSCH is applied, the pulse signals 40a, 40d, 40f are respectively rendered to a high level, and the pulse signals 40b, 40c are respectively turned to a low level.

At this time, when a low level high-voltage detection signal HVDET is applied to the double booster circuit 47, the NMOS transistor 485 in the pulse input controller 47a is turned off, and the first transmission gate 471 and the second transmission gate 476 are respectively turned on to an operable state. Accordingly, the first transmission gate 471 is turned on and the pulse signal 40d outputted from the pulse timing controller 40 is applied thereto.

When the pulse signal 40d is a low level, it is applied to an input terminal of the third NOR gate 475 in the pulse transmission unit 47b, and to another terminal of the third NOR gate 475 in the pulse transmission unit 47b, there is applied a high level signal delayed and inverted while passing through the third delay unit 472 and the eighth NOT gate 473. The third NOR gate 475 supplies a low signal NORed therein to a gate of the transistor 484 through the fourth delay unit 481, whereby the transistor 484 is turned off.

At this time, the fourth NOR gate 477 in the operation signal output unit 47c NORs a low level signal which passed through the third NOR gate 475 in the pulse transmission unit 47b, and the low level pulse signal 40d that passed through the first transmission gate 471. The NORed high level signal is inverted through the ninth NOT gate 478 to a low level signal, which is in turn transmitted to an input terminal of the fifth NOR gate 479. The low level signal outputted from the ninth NOT gate 478 and a low level pulse signal 40f outputted from the second transmission gate 476 are NORed in the fifth NOR gate 479 which in turn generates a high level signal, so that the level shifter 480 is not operated. Accordingly, the PMOS transistor 486 in the raised voltage controller 47d becomes turned off.

The transistor 487 is turned on by a low level signal that passed through the first transmission gate 471 and a high level signal inverted through the tenth NOT gate 483, after the AND gate 482. The transistor 488 is turned on by a high level high-voltage detection signal HVDET, which is inverted by the seventh NOT gate 470, whereby the node 40e is rendered to be a low level.

When the oscillation pulse signal OSCH is turned from a low level to a high level so that the pulse signals 40d, 40f are also respectively turned to a high level, a high level pulse signal 40d, which passed through the first transmission gate 471, and a low level signal delayed and inverted when the high level pulse signal 40d, which passed through the first transmission gate 471, is sequentially passed through the third delay unit 472 and the eight NOT gate 473, are NORed in the third NOR gate 475 of the first pulse transmission gate 47b. The low level signal obtained from the third NOR gate 475 is provided through the fourth delay unit 481 to the gate of the transistor 484, whereby the transistor 484 is turned from a turn-on state to a turn-off state.

The fourth NOR gate 477 in the operation signal output unit 47c NORs a low level signal (which passed through the third NOR gate 475 of the first pulse transmission unit 47b) and a high level signal (which passed through the first transmission gate 471). The resultant low level signal is outputted to the ninth NOT gate 478. The high level signal inverted by the ninth NOT gate 478 and a high level pulse signal 40f which passed through the second transmission gate 476 are NORed in the fifth NOR gate 479.

When the low level signal obtained from the fifth NOR gate 479 is applied to the level shifter 480, the level shifter 480 is operated to thereby output a low level pulse signal to the gate of the PMOS transistor 486. At this time, the transistor 487 is turned off by the AND gate 476 and the tenth NOT gate 483, whereby the PMOS transistor 486 is turned on and the node 402 is rendered to a Vdd−Vt potential.

When the high voltage detection signal HVDET is turned from a low level to a high level, the first transmission gate 471 and the second transmission gate 476 are turned off, so that the pulse transmission unit 47b and the operation signal output unit 47c are inoperative, whereby the transistor 485 in the input pulse controller 47a is turned on. If the pulse signal 40c is at a low level, the node 40e remains in a low level, and if the pulse signal 40c is at a high level, the node 40e comes to have a Vdd−Vt potential.

Respective drains of a pair of MOS transistors in each of the first and second clamp 45, 46 are commonly connected to the supply voltage. Each gate of the pair of MOS transistors in each of the first and second clamp 45, 46 is connected to each drain thereof. The potential at the node 41a is clamped to thereby maintain the nodes 43a, 44a to have a predetermined voltage if it is more than a predetermined level,.

Drains and gates of a plurality of NMOS transistors in each of the first and second clippers 48, 49 are connected to each other, one after another. The plurality of NMOS transistors in each of the first and second clippers 48, 49 are connected in parallel with each other starting from supply voltage Vdd. When the supply voltage Vdd is applied as a high level, a predetermined voltage is clipped so that the nodes 41a, 44a maintain a predetermined voltage.

The first through fourth pumping capacitors 41–44, as shown in FIG. 5, respectively employ a P-type transistor capacitor. As shown in FIG. 8, the first through fourth pumping capacitors 41'–44' respectively obtain effects identical to those of the first through fourth pumping capacitors 41–44 using n-type transistor capacitors.

Finally, with reference to FIG. 3, the high voltage detector 22 will now be described. During an initial power-up, a high level power up signal is applied, the transistor 202 is turned on to thereby operate the reference voltage generator 200a. The reference voltage generator 200a generates a reference voltage, which is applied to the level detector 200b.

In accordance with the reference voltage, the transistor 213 in the level detector 200b is turned on. When a high level supply voltage Vdd is applied, a high level signal is detected after passing through a plurality of diode-type transistors 209–212 in the level detector 200b. The high level signal is provided to the first inverting unit 200c. The transistors 216, 217 in the first inverting unit 200c are turned off, and the transistor 218 is turned on and bypassed toward ground voltage Vss, whereby a low level signal is supplied to the second inverting unit 200d.

The low level signal is inverted in the second inverting unit 200d to a high level signal and provided to the third inverting unit 200e. Then, the transistor 220 in the third inverting unit 200e is turned off, and the transistor 221 is turned on. The transistor 222 is turned on in accordance with a reference voltage of the reference voltage generator 200a, whereby a low level signal is provided to the fourth inverting unit 200f. After passing through NOT gates 224–226 of the fourth inverting unit 200f, a high level high-voltage detection signal HVDET is outputted.

When the supply voltage Vdd is applied as a low level, the signal detected through the diode-type transistors 209–212 in the level detector 200b becomes a low level. The low level signal serves to turn off the transistor 218 in the first inverting unit 200c, and the transistors 216, 217 are turned on, thereby providing a high level signal to the second inverting unit 200d.

The second inverting unit 200d inverts a high level signal to a low level signal. The inverted signal turn off the transistor 221 of the third inverting unit 200e, and the transistor 220 is turned on. A high level signal is provided to the fourth inverting unit 200f. The high level signal passes through the NOT gates 224–226 in the fourth inverting unit 200f and is turned to a low level high-voltage detection signal HVDET.

In a semiconductor memory device, using an externally applied supply voltage Vdd or an internal voltage Vint, the regulator 23, the oscillator 24, the high voltage detector 22, and the charge pump 25 are operated. The supply voltage or internal voltage are applied as a low level, and although it is applied as a high level, a desirably raised voltage is generated.

As described above, the charge pump circuit having a high efficiency for a semiconductor memory device uses the double booster circuit in the charge pump to separate two output transistors for charge transmission while decreasing consumption amount of the raised voltage. The gate voltage of the output transistor is increased to a 2Vdd+Vt potential. The 2Vdd drain voltage of the output transistor serves as the raised voltage for thereby improving charge supply efficiency, and decreases power amount by supplying an appropriate amount of charge when there is applied a high voltage.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A charge pump circuit for a semiconductor memory device, comprising:
    a high voltage detector for outputting a high voltage detection signal when an applied supply voltage reaches a predetermined voltage level;
    a regulator for outputting a high level on signal when a raised voltage is lowered below a predetermined voltage while detecting the raised voltage being applied during a power-on;
    a controller being triggered at a descent edge of a row access strobe bar signal and outputting a high level row access strobe bar pulse signal;
    an oscillator for generating an oscillation pulse signal in accordance with the high level on-signal outputted from the regulator;
    a charge pump for carrying out a pumping operation until the oscillation pulse signal reaches a potential of (Vdd+2Vt) when the oscillation pulse signal is applied thereto from the oscillator, and for halting the pumping operation when the high-voltage detection signal of a high level is applied;
    a pull-up transistor for precharging the raised voltage to a potential value of (Vdd−Vt) when power is turned on; and
    a decoupling capacitor connected to a final output terminal and for carrying out a charge accumulation and a decoupling operation.

2. The circuit of claim 1, wherein the high voltage detector, comprises:
    a reference voltage generator for generating a randomly determined reference voltage when power is turned on;
    a level detector for detecting a level of applied supply potential and outputting the detected signal; and
    first through fourth inverters for delaying the detection signal of the level detector for a predetermined time, adjusting its output timing, and outputting the adjusted signal.

3. The circuit of claim 2, wherein said level detector includes a four-diode type transistor and a transistor controlled by the reference voltage, which are connected in parallel with each other.

4. The circuit of claim 1, wherein the charge pump, comprises:
    a pulse timing controller for generating a first to fifth pulse signals having a predetermined pulse width in accordance with at least one of a level of the row access strobe bar pulse signal and the oscillation pulse signal;
    first through fourth pumping capacitors for carrying out a pumping operation in accordance with a corresponding level of pulse signals outputted from the pulse timing controller;
    a double booster circuit for receiving the third through fifth pulse signals generated from the pulse timing controller, carrying out a double boosting operation to obtain a required level thereof, and halting the double boosting operation when the high-voltage detection signal of a high level is applied;
    a pull-up transistor for maintaining an output node of the first pumping capacitor at a potential of (Vdd−Vt) when power is turned on;
    a second clamp for clamping a potential of an output node between the output node of the first pumping capacitor and an output node of the fourth pumping capacitor, and maintaining the output node to a predetermined level voltage;
    a first clamp for clamping the voltage of the output node between the output nodes of the third pumping capacitor, and maintaining the output node to a predetermined level voltage;
    first and second clippers for clipping the applied high voltage supply voltage to a predetermined voltage, and maintaining the corresponding output nodes of the first and fourth pumping capacitors respectively to a predetermined level voltage in accordance with the clipped voltage;
    a MOS transistor for maintaining the output node of the second pumping capacitor to the supply potential Vdd during an initial pumping; and
    a first and second output transistors for transmitting the charge of the output node to an output node when boosted.

5. The circuit of claim 4, wherein the first transmission transistor is turned on/off in accordance with an output signal of the third pumping capacitor or the first clamp.

6. The circuit of claim 4, wherein the second transmission transistor is turned on/off in accordance with an output signal of at least one of the fourth pumping capacitor and the second clamp.

7. The circuit of claim 4, wherein the pulse timing controller, comprises:
    a NOR gate for NORing the row access strobe bar pulse signal and oscillation pulse signal, and outputting a fifth pulse signal to the double booster circuit;

a first NOT gate for inverting an output pulse signal of the NOR gate;

first and second delay units for delaying an output signal of the first NOT gate for a predetermined time;

a first pulse generator for receiving a pulse signal which sequentially passed through the first and second delay units, generating a first pulse signal in accordance with a logic combination, and outputting the generated signal to the first pumping capacitor;

a second pulse generator for controlling timing of signals which passed through the first delay unit, generating a second pulse signal having a phase thereof contrary to that of the first pulse signal, and outputting the generated signal to the second pumping capacitor; and a third pulse generator for receiving a pulse signal which sequentially passed through the first NOT gate, and the first and second delay units for carrying out a logic combination, and generating a third and fourth pulse signals wherein the third pulse signal is outputted to the third pumping capacitor and the fourth pulse signal is outputted to a double booster circuit.

8. The circuit of claim 7, wherein the first pulse generator, comprises:

a first NOR gate for NORing a pulse signal which sequentially passed through the first NOT gate and the second delay unit, and generating a first pulse signal; and second and third NOT gates for delaying for a predetermined time and outputting the first pulse signal which passed through the first NOR gate so as to control signal timing of the first pulse signal.

9. The circuit of claim 8, wherein the second pulse generator includes fourth and fifth NOT gates for inverting a signal which passed through the first delay unit as a second pulse signal, and delaying for a predetermined time to accomplish a timing adjustment.

10. The circuit of claim 7, wherein the third pulse generator comprises:

a first NAND gate for NANDing a signal which passed through the first NOT gate and a signal which passed through the first and second delay units, and generating a fourth pulse signal; and a sixth NOT gate for inverting the fourth pulse signal outputted from the first NAND gate, and outputting the inverted signal serving as the third pulse signal.

11. The circuit of claim 4, wherein the double booster circuit comprises:

a pulse transmission unit for transmitting a fourth pulse signal outputted from the pulse timing controller;

an operation signal output unit for applying a logic operation to a fifth pulse signal outputted from the pulse timing controller and a pulse signal transmitted thereto through the first pulse transmission unit, and outputting the combined signal;

a level shifter being operated in accordance with an operation signal of the level shifter operation unit, and outputting a low level pulse signal;

a raised voltage controller for controlling a raised voltage in accordance with output signals of the level shifter; and a pulse input controller for one of transmitting to the pulse transmission unit and the operation signal output unit, and blocking a pulse signal outputted from the pulse timing controller in accordance with an applied high voltage detection signal.

12. The circuit of claim 11, wherein the pulse transmission unit comprises:

a third delay unit for receiving a fourth pulse signal outputted from the pulse timing controller, and delaying the received signal for a predetermined time;

an eight NOT gate for inverting an output signal of the third delay unit and outputting the resultant signal; and a third NOR gate for NORing a signal which passed through the eight NOT gate and the fourth pulse signal, and outputting the NORed signal.

13. The circuit of claim 11, wherein the operation signal output unit comprises:

a fourth NOR gate for NORing an output signal of the pulse transmission signal and the fourth pulse signal outputted from the pulse timing controller;

a ninth NOT gate for inverting an output signal of the fourth NOR gate and outputting the resultant signal;

a fifth NOR gate for NORing the fifth pulse signal outputted from the pulse timing controller and an output signal of the ninth NOT gate, and generating a level shifter operation signal;

a second NAND gate for the fourth pulse signal and a fourth pulse signal delayed for a predetermined time passing through the third delay unit in the pulse transmission unit; and a tenth NOT gate for inverting an output signal of the second NAND gate and outputting the resultant signal.

14. The circuit of claim 11, wherein the raised voltage controller includes a PMOS transistor and a pair of NMOS transistors, which are connected in parallel with each other.

15. The circuit of claim 11, wherein the pulse input controller comprises:

first and second transmission gates for one of blocking a corresponding fourth pulse signal and a corresponding fifth pulse signal in accordance with a high voltage detection signal; and an NMOS transistor for controlling a raised voltage in the raised voltage controller by being turned on/off in accordance with the high voltage detection signal.

16. The circuit of claim 4, wherein between a supply voltage and a pumping capacitor in each of the first and second clamps, and a gate terminal of a MOS transistor is connected to a source terminal of another MOS transistor.

17. The circuit of claim 4, wherein between a supply voltage and a pumping capacitor in each of the first and second clippers, there are provided a plurality of NMOS transistors connected in parallel with each other and each drain of the NMOS transistors is connected to a corresponding one of gates of the NMOS transistors.

18. The circuit of claim 4, wherein the first and fourth pumping capacitors are respectively formed of a P-type capacitor.

19. The circuit of claim 18, wherein the first and fourth capacitors are respectively compatible with an N-type capacitor.

* * * * *